United States Patent [19]

Kubo et al.

[11] Patent Number: 5,014,349
[45] Date of Patent: May 7, 1991

[54] TELEVISION TUNER FOR COMMON USE IN BS/UV

[75] Inventors: Kazuhiko Kubo, Mishima; Akira Usui, Takatsuki; Seiji Sakashita, Yahata; Hiroaki Ozeki, Neyagawa; Ippei Kanno, Hirakata, all of Japan

[73] Assignee: Matsushita Electric Industrial Co., Ltd., Osaka, Japan

[21] Appl. No.: 397,451

[22] PCT Filed: Dec. 23, 1988

[86] PCT No.: PCT/JP88/01313
§ 371 Date: Aug. 14, 1989
§ 102(e) Date: Aug. 14, 1989

[87] PCT Pub. No.: WO89/06072
PCT Pub. Date: Jun. 29, 1989

[30] Foreign Application Priority Data
Dec. 23, 1987 [JP] Japan .................. 62-325863

[51] Int. Cl.⁵ ............................. H04B 17/02
[52] U.S. Cl. ................... 455/189; 455/143; 455/315; 358/188
[58] Field of Search ................. 455/142–144, 455/4–6, 188–191, 182–183, 185–186, 315; 358/86, 181, 188

[56] References Cited
U.S. PATENT DOCUMENTS

| | | | |
|---|---|---|---|
| 4,214,212 | 7/1980 | Dipietromaria | 455/190 |
| 4,352,209 | 9/1982 | Ma | 455/315 |
| 4,553,264 | 11/1985 | Hasegawa et al. | 455/189 |
| 4,592,093 | 5/1986 | Ouchi et al. | 455/4 |
| 4,731,877 | 3/1988 | Moon | 455/188 |
| 4,907,292 | 3/1990 | Leipert | 455/188 |

FOREIGN PATENT DOCUMENTS
3226980 1/1984 Fed. Rep. of Germany.

OTHER PUBLICATIONS
Takeshi Sato et al, 64-Channel CATV Up/Down Converter, National Technical Report, vol. 30, No. 1, Feb. 1984, pp. 71–77.
Seiji Sakashita et al, High-Performances BS Tuner, National Technical Report, vol. 34, No. 5, Oct. 1988, pp. 54–61.

Primary Examiner—Reinhard J. Eisenzopf
Assistant Examiner—Andrew Faile
Attorney, Agent, or Firm—Stevens, Davis, Miller & Mosher

[57] ABSTRACT

The invention relates to a television receiving tuner for receiving television signals of VHF band/UHF band, a CATV signal, and a satellite television broadcasting signal. As a circuit for receiving the television signals of the VHF band/UHF band and the CATV signal as a first input signal, there is provided a double super type tuner of the up/down converter system including a first local oscillator (6) and a first mixer (5) which construct an up converter and a second local oscillator (10) and a second mixer (9) which construct a down converter. When the satellite television broadcasting signal as a second input signal is received, the first local oscillator (6) and the first mixer (5) in the up converter section are switched by switching circuits (12, 13) and used as a down converter. At least the first local oscillator (6) and the first mixer (5) are commonly used both for reception of the television signals of the VHF band/UHF band and the CATV signal and for reception of the satellite television broadcasting signal, thereby accomplishing the simplification of the construction and the low costs.

5 Claims, 4 Drawing Sheets

5,014,349

TELEVISION TUNER FOR COMMON USE IN BS/UV

TECHNICAL FIELD

The present invention relates to a television signal receiving tuner for receiving a general television broadcasting signal, a CATV signal, or a satellite television broadcasting signal.

BACKGROUND ART

In recent years, due to the development of new media, even in general television sets, there is needed a system for enabling a single television receiver to receive an off-air TV signal (a TV signal which is broadcasted from a broadcasting station by radio waves), a CATV signal (a television signal which is transmitted through a cable), a satellite television broadcasting signal (a television signal which is broadcasted by radio waves through a broadcasting satellite), and the like. In such a case, generally both of the off-air television signal and the CATV signal are received by a single tuner and the satellite television broadcasting signal is received by another tuner and the system using those two tuners is provided in a television set.

FIG. 4 shows a construction of a BS tuner for receiving the satellite broadcasting signal. Reference numeral 21 denotes an input filter; 22 indicates a first IF amplifier; 23 a mixer; 24 a local oscillator; 25 a second IF amplifier; and 26 a prescaler.

In FIG. 4, the satellite television broadcasting signal is block converted into a first intermediate frequency (1.0 to 1.3 GHz) by a converter unit (not shown) provided for an SHF receiving antenna (parabolic antenna, plane antenna) and is input to an input terminal C. The input filter 21 is a band pass filter for allowing only the signal of the first intermediate frequency (hereinafter, abbreviated to BSIF) to pass. The BSIF signal is amplified by the first IF amplifier 22 including an automatic gain controller and is input to the mixer 23. In the mixer 23, the BSIF signal is mixed to an oscillation output from the local oscillator 24 and their differential frequency component is taken out as a second IF signal (134 MHz or 403 MHz). The second IF signal is amplified by the second IF amplifier 25 and is output from an output terminal D and is supplied to a frequency demodulator. On the other hand, a station selecting frequency control voltage from a station selecting control circuit is input to a terminal F' and is given to the local oscillator 24. The oscillation output from the local oscillator 24 is also supplied to the prescaler 26, by which it is frequency divided and supplied to a PLL frequency synthesizer circuit of the station selecting control circuit from a terminal E'.

FIG. 5 shows a construction of a conventional TV tuner for receiving a VHF/UHF TV broadcasting signal and a CATV signal. In FIG. 5, reference numerals 31 to 36 denote circuits to receive television signals of the VHF and CATV channels. Reference numerals 37 to 42 indicate circuits to receive a television signal of the UHF channel. In the VHF/CATV channel receiving circuit, reference numeral 31 denotes an input tuning filter; 32 indicates an RF amplifier including an automatic gain controller; 33 a double-tuned filter between stages; 34 a mixer; 35 a local oscillator; and 36 an IF amplifier including an automatic gain controller. In the UHF channel receiving circuit, reference numeral 37 denotes an input tuning filter; 38 an RF amplifier including an automatic gain controller; 39 a double-tuned filter between stages; 40 a mixer; 41 a local oscillator; and 42 a switching circuit.

In the television tuner of FIG. 5, the television signals of the VHF band and CATV channel which were input from the antenna to a terminal A are channel selected by the input tuning filter 31 and are amplified by the RF amplifier 32 including the automatic gain controller and are further band limiting by the double-tuned filter 33 between stages and are input to the mixer 34. On the other hand, a local oscillation signal from the local oscillator 35 is also input to the mixer 34. An IF signal having the frequency of the difference between both of those input signals is taken out and is amplified by the IF amplifier 36 including the automatic gain controller and is output to a terminal B. The output IF signal from the terminal B is supplied to a next VIF circuit and is AM detected.

Then, the television signal of the UHF band is input from the antenna to a terminal G and is channel selected by the input tuning filter 37 and is amplified by the RF amplifier 38 including the automatic gain controller. The amplified signal is further band limited by the double-tuned filter 39 between stages and is input to the mixer 34. On the other hand, a local oscillation signal from the local oscillator 41 is also input to the mixer 40. Those input signals are converted into an IF signal having the frequency of the difference between them and the IF signal is input to the mixer 34 through the switching circuit 42. In this case, the mixer 34 operates as an IF amplifier for the UHF television IF signal. The IF signal is further amplified by the IF amplifier 36 and is output to the terminal B. On the other hand, a station selecting frequency controlled voltage from the station selecting control circuit is supplied to a terminal F'''. Upon both of the VHF/CATV reception and the UHF reception, the same control voltage is supplied to the local oscillators 35 and 41, double-tuned filters 33 and 39 between stages, and input tuning filters 31 and 37. The television tuner system is of the single super type and almost of the general TV tuners are constructed by such a type.

As mentioned above, in the television set constructed so as to receive the TV signals of the general VHF, UHF, and CATV and the satellite television broad-casting signal, as its tuner section for reception, two kinds of tuners must be provided by individually respectively constructing the tuners shown in FIGS. 4 and 5. Thus, the circuit construction becomes complicated, and a large number of parts are needed, and the costs cannot be reduced.

In consideration of the above problems, it is an object of the present invention to provide a tuner for receiving a television signal in which the circuit construction can be simplified and the costs can be remarkably decreased.

DISCLOSURE OF INVENTION

To accomplish the above object, a television receiving tuner of the present invention is characterized in that, as a circuit to receive at least one of television signals of the VHF band/UHF band and the CATV signal as a first input signal, there is provided a double super heterodyne circuit of the up/down converter type including a first local oscillator and a first mixer which construct an up converter and a second local oscillator and a second mixer which construct a down converter, when a satellite television broadcasting signal as a second input signal is received, the first local oscillator and the first mixer in the up converter section are used as a down converter, and at least the first local oscillator and the first mixer are commonly used for reception of the television signals of the VHF band-/UHF band and/or the CATV signal and for reception of the satellite television broadcasting signal.

With the above construction, the television signals of the VHF band/UHF band and/or the CATV signal and the satellite television broadcasting signal can be received by the common circuit and there is no need to use receiving circuits of quite different two systems. Therefore, the circuit construction can be simplified, the number of parts can be also reduced, and the tuner of the low costs can be realized.

BEST MODE FOR CARRYING OUT THE INVENTION

A television receiving tuner in an embodiment of the present invention will be described hereinbelow with reference to the drawings.

Figure 1:
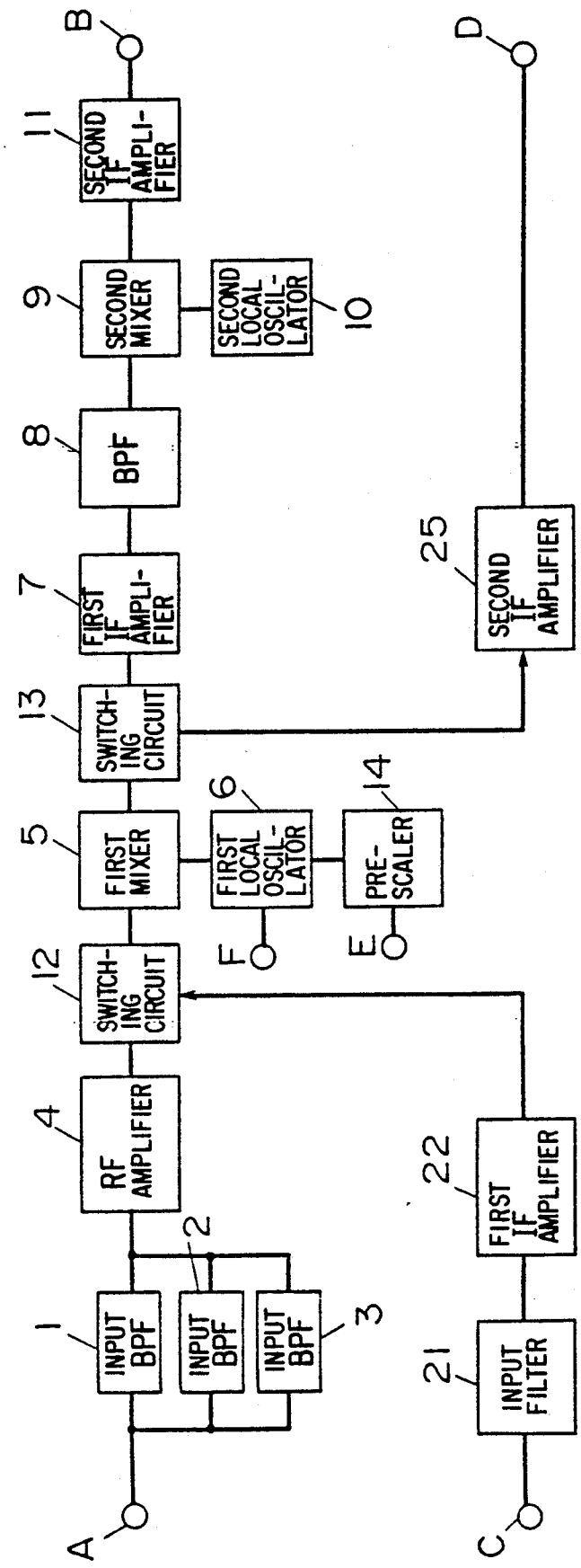
FIG. 1 is a block diagram of a television receiving tuner in an embodiment of the present invention.

FIG. 1 shows a television tuner in an embodiment of the invention.

Reference numerals 1 to 14 denote a double super tuner section for reception of television broadcasting signals of the VHF band/UHF band and for reception of a CATV signal. The off-air television signals of the VHF band/UHF band and the CATV signal which are input from the terminal A are converted into the first IF signal of a high frequency and are further converted at mixer 9 another IF signal of a low frequency (58.75 MHz in Japan). The IF signal output is from mixer 9 amplified by amplified 11 and output to a terminal B.

Reference numerals 12 and 13 denote diode switches or switching circuits comprising high frequency relays or the like for switching between the reception of the television signals of the VHF band/UHF band and the CATV signal and the reception of the satellite television broadcasting.

When the switches 12 and 13 were switched to the side of the reception of the satellite television broadcasting, a BSIF signal which was input from a terminal C passes through the input band bass filter 21 and first IF amplifier 22 and is input to the switching circuit 12. Then, the BSIF signal passes through a common circuit of the first mixer 5, first local oscillator 6, and prescaler 14 and is outputted at mixer 5 as a second IF signal. Then it is transmitted through the switching circuit 13 and second IF amplifier 25 and is output to a terminal D.

Figure 2:
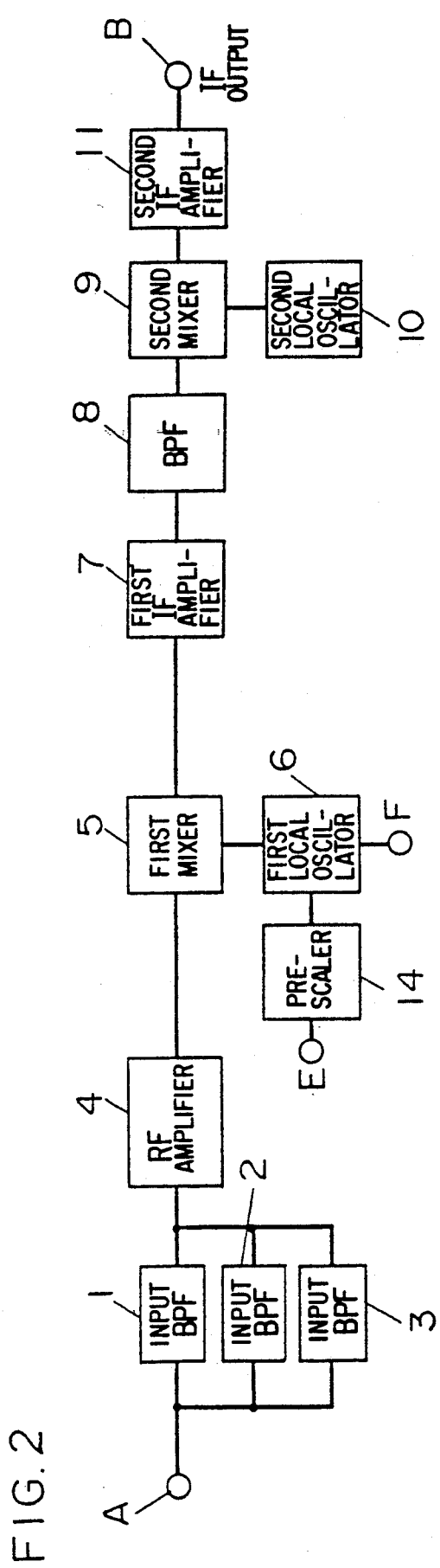
FIG. 2 is a block diagram of its double super tuner section.
Figure 3:
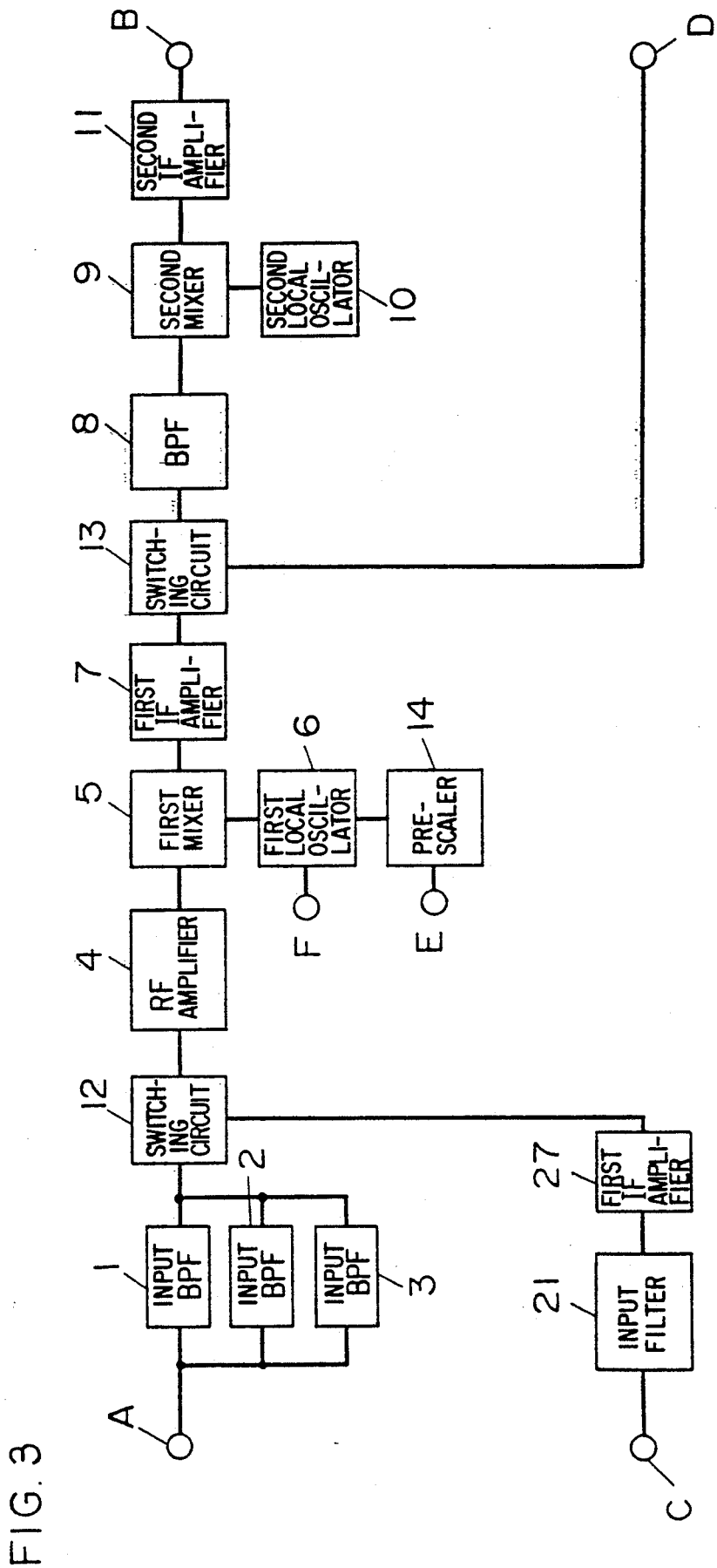
FIG. 3 is a block diagram of a television receiving tuner in another embodiment of the invention.
Figure 5:
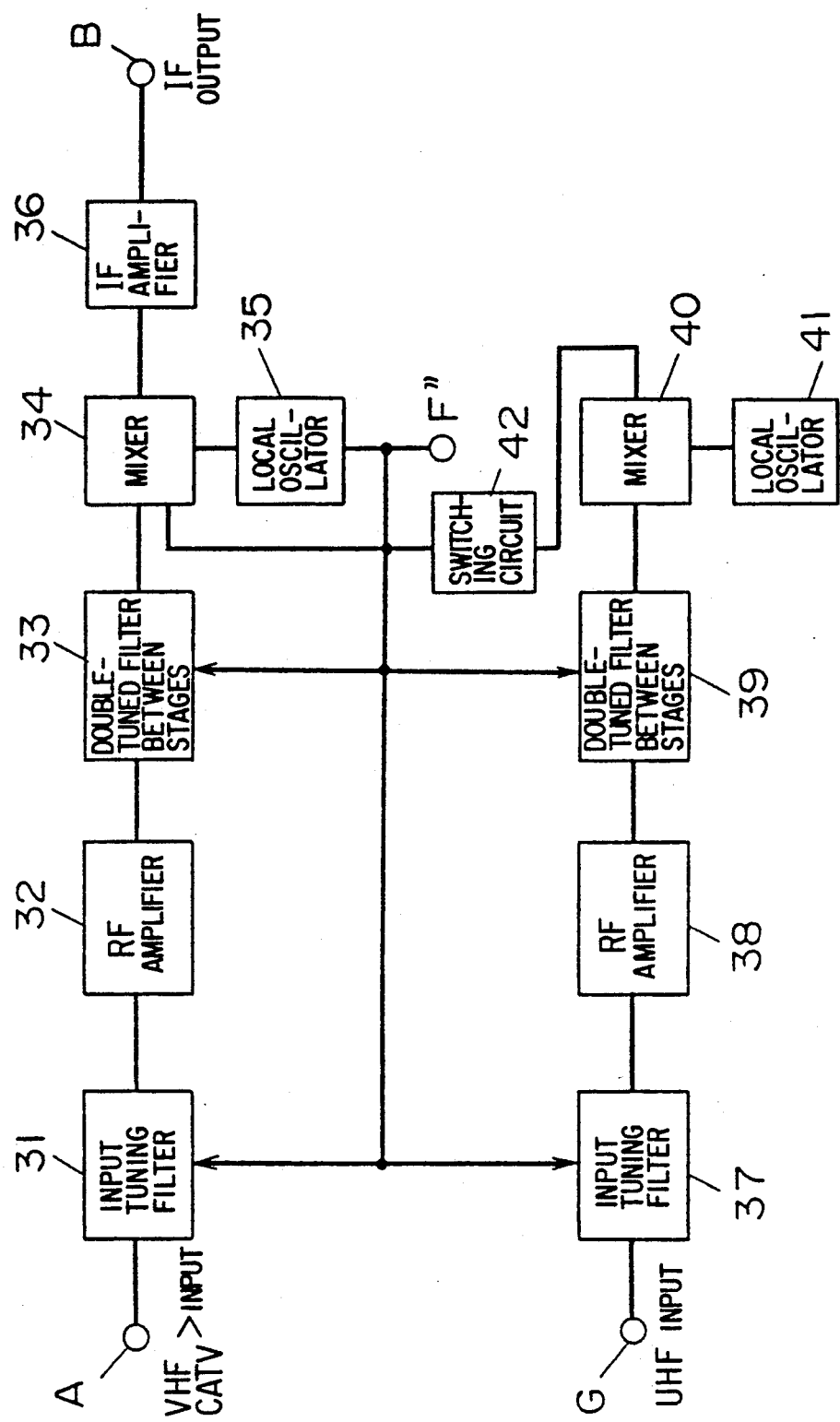
FIG. 5 is a block diagram of a single super tuner in a conventional example.

Only a double super tuner section to receive the off-air signal and CATV signal in the above embodiment is extracted and shown in FIG. 2. In FIG. 3, reference numerals 1 to 3 denote input band pass filters; 4 indicates an RF amplifier; 5 a first mixer; 6 a first local oscillator; 7 a first IF amplifier; 8 a band pass filter (BPF); 9 a second mixer; 10 a second local oscillator; 11 a second IF amplifier; and 14 a prescaler.

In FIG. 2, reference numerals 1 to 3 denote the input band pass filters which are provided for respective bands (for instance, VHF and, CATV band, UHF band). The television signal of the VHF band/UHF band or the CATV signal which had been input from the terminal A and passed through either one of the filters 1 to 3 is amplified by the wide band amplifier 4 including the automatic gain controller and is input to the first mixer 5. The input signal is mixed by the first mixer 5 to the first local oscillation signal which is supplied from the first local oscillator 6. The component having the frequency of the difference between those input signals is taken out as a first IF signal. The frequency of the first IF signal is selected to 900 to 1000 MHz. The first IF signal is amplified by the first IF amplifier 7. Only the first IF signal is further selected by the band pass filter 8 and is input to the second mixer 9. The first IF signal is mixed to the second local oscillation signal which is supplied from the third local oscillator 10. The component having the frequency of the difference between those input signals is taken out as a third IF signal. The frequency of the second IF signal is selected to 58.75 MHz in the case of Japan. The third IF signal is amplified by the third IF amplifier 11 and is output as a second IF signal output from the terminal B to VIF circuit at the next stage. The tuning frequency controlled voltage for selecting a station from the station selecting control circuit is applied from a terminal F to the first local oscillator 6. On the other hand, the local oscillation signal of the first local oscillator 6 is frequency divided by the prescaler 14 and its frequency divided output is supplied to the station selecting control circuit from a terminal E.

The above tuner construction is of the double super type and relates to the system which is advantageous for the multi-channel reception of the VHF band/UHF band, CATV, and the like and for the wide band reception. Although such a system is not yet generally used as a tuner, it is considered to be the system which will be necessary in future.

Figure 4:
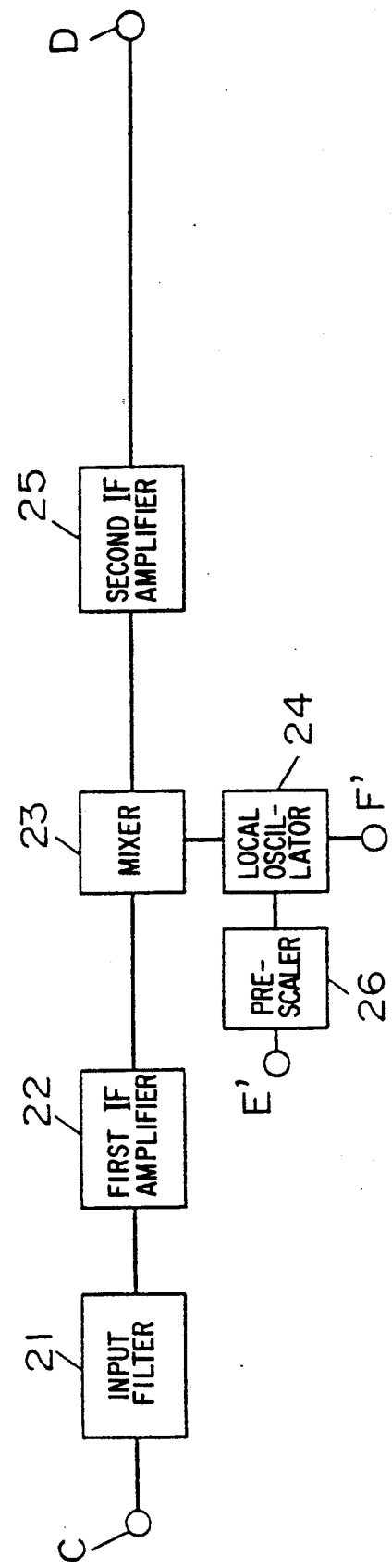
FIG. 4 is a block diagram of a satellite broadcasting receiving tuner section in a conventional example.

The television receiving tuner of FIG. 1 is fundamentally constructed by combining the double super type tuner of FIG. 2 and the system of FIG. 4 mentioned above. To construct both of them as a single tuner, the switching circuits 12 and 13 are provided and the first local oscillating frequency is selected.

The first local oscillating frequency to convert the BSIF signal of the satellite television broadcasting into the intermediate frequency signal which is output from the terminal D will now be calculated. In the case of Japan, the frequency of the BSIF signal lies within a range from 1-35.98 to 1331.5 MHz. Assuming that the intermediate frequency which is output is set to 402.78 MHz, it is sufficient to change the first local oscillating frequency from $1035.98 + 402.78 = 1438.76$ (MHz) to $1331.54 + 402.78 = 1734.28$ (MHz).

On the other hand, in the case of the double super type tuner for the VHF band/UHF band and the CATV, since the first IF frequency needs to be avoided from the broadcasting signal band, it is necessary to select to a frequency of 800 MHz or higher. Therefore, the first local oscillating frequency is varied in at least a range from 890 to 1570 MHz. Accordingly, if the local oscillating frequency variable range in the case of the double super type tuner is extended to a slightly higher frequency or if the first IF frequency is set to a higher frequency, the local oscillating frequency for the satellite television broadcasting can be covered and the first mixer 5, local oscillator 6, and prescaler 7 can be commonly used.

On the other hand, in the case of the conventional single super type tuner, since the local oscillating frequency is also low, the local oscillator cannot be commonly used and a double-tuned filter between stages is necessary after the RF amplifier 4, so that it is difficult to construct the switching circuits. In the case of the double super type, if the switching circuits are constructed as shown in FIGS. 1 and 2, since a wide band amplifier is used, an a periodic circuit can be constructed and there are advantages such that the impedance is also low and the switching circuits can be easily constructed.

As mentioned above, according to the embodiment, the double super type tuner is used for reception of the television signals of the VHF band/UHF band and the CATV signal, the switching circuits 12 and 13 are provided on both of the input side and the output side of the first mixer circuit 5, the switching is executed with the BSIF signal side, so that the local oscillator, mixer, and prescaler can be commonly used and the size and costs can be remarkably reduced.

Another embodiment of the present invention will now be described with reference to the drawings.

FIG. 3 shows a construction of a television receiving tuner in the second embodiment of the invention. In FIG. 3, reference numerals 1 to 11, 14, and 21 denote the same parts and components as those in FIG. 1. Although reference numerals 12 and 13 denote switching circuits, their inserting positions differ from those in the case of FIG. 1. In FIG. 3, the switching circuit 12 is inserted on the input side of the RF amplifier 4 and the switching circuit 13 is inserted between the first IF amplifier 7 and the BPF 8, respectively. Reference numeral 27 denotes a first IF amplifier.

In the television receiving tuner constructed as mentioned above, the switching circuit 12 is provided between the input filters 1 to 3 and the RF amplifier 4 and the switching circuit 13 is provided between the first IF amplifier 7 and the BPF 8. Thus, the RF amplifier 4 operates as a first IF amplifier upon reception of the BSIF signal. The first IF amplifier 7 operates as a second IF amplifier of the band of 403 MHz. The block comprising the RF amplifier 4, first mixer 5, first local oscillator 6, first IF amplifier 7, and prescaler 14 can be commonly used. The first IF amplifier 27 functions as a buffer amplifier having the gain of a few dB and supplements the decrease in gain in the 1.3 GHz band in the RF amplifier 4. At the same time, the first IF amplifier 27 also operates as a buffer to prevent the local oscillation leakage to the terminal C upon reception of the general television broadcasting signal. As mentioned above, since such a construction is also of the double super type, the circuit of the RF amplifier 4 and first IF amplifier 7 can be commonly used as a wide band amplifier.

As mentioned above, according to the embodiment, the circuits 22 to 26 in FIG. 4 can be omitted due to the common use and the size and costs can be extremely reduced.

INDUSTRIAL APPLICABILITY

As mentioned above, according to the invention, the tuner section to receive the off-air television signals of the VHF band/UHF band and the CATV signal is constructed by the double super system, a part or all of the RF amplifier, mixer, local oscillator, prescaler, and first IF amplifier are commonly used with a part or all of the first IF amplifier, mixer, local oscillator, prescaler, and second IF amplifier in the tuner for receiving the BSIF signal of the satellite television broadcasting through the input/output switching circuits. Thus, the costs and size can be remarkably reduced and its practical effect is large.

What is claimed is:

1. A tuner for receiving a television signal having a first input terminal to which at least one of television signals of VHF/UHF band or a CATV signal is input as a first input signal and a second input terminal to which a BSIF signal which was obtained by frequency converting a satellite television broadcasting signal is input as a second input signal, said tuner comprising:
   a first local oscillator for generating a first local oscillation signal for converting said first input signal into a first intermediate frequency signal of 900 to 1000 MHz, said first intermediate frequency signal having a frequency higher than a frequency of the first input signal, and for converting said second input signal into a second intermediate frequency signal having a frequency lower than a frequency of the second input signal;
   a first mixer which, responsive to receipt of the first input signal, mixes and converts said first input signal and said first local oscillation signal into said first intermediate frequency signal and, responsive to receipt of said second input signal, mixes and converts said second input signal and the first local oscillation signal into the second intermediate frequency signal;
   a first switching circuit for selectively supplying said first and second input signals to said first mixer;
   a second local oscillator and a second mixer for converting the first intermediate frequency signal of an output of a frequency lower than the frequency of the first intermediate frequency signal when the first input signal is received;
   a first output terminal for outputting said third intermediate frequency signal;
   a second output terminal for outputting the second intermediate frequency signal which was output from the first mixer when the second input signal is received; and
   a second switching circuit for switching between the first intermediate frequency signal which is output to the second mixer and said second intermediate frequency signal which is output to the second output terminal.

2. A tuner for receiving a television signal according to claim 1, further comprising and RF amplifier for amplifying said first input signal and a BSIF amplifier for amplifying said second input signal provided at the front stage of said first switching circuit.

3. A tuner for receiving a television signal according to claim 1, further comprising amplifier for amplifying both of said first and second input signals provided between said first switching circuit and said first mixer.

4. A tuner for receiving a television signal according to claim 1, further comprising an IF amplifier provided between said first mixer and said second switching circuit for amplifying alternately said first intermediate frequency signal and said second intermediate frequency signal as they are alternately output from said first mixer.

5. A tuner for receiving a television signal according to claim 1, further comprising an RF amplifier provided between said first switching circuit and said first mixer for amplifying alternately said first and second input signals as they are selectively supplied from said first switching circuit and an IF amplifier provided between said first mixer and said second switching circuit for amplifying alternately said first intermediate frequency signal and second intermediate frequency signal as they are alternately output from said first mixer.

* * * * *